United States Patent [19]

Craddock

[11] Patent Number: 5,043,610

[45] Date of Patent: Aug. 27, 1991

[54] ELECTRICAL COUPLING CIRCUIT FOR PASSING A VARYING SIGNAL AND BLOCKING A DIRECT COMPONENT THEREOF

[75] Inventor: Russell W. Craddock, Birmingham, Great Britain

[73] Assignee: Lucas Industries Public Limited Company, Birmingham, United Kingdom

[21] Appl. No.: 437,595

[22] Filed: Nov. 17, 1989

[30] Foreign Application Priority Data

Nov. 17, 1988 [GB] United Kingdom ............... 8826907

[51] Int. Cl.$^5$ .......................... H03K 5/13; H03K 3/01; G06G 7/10
[52] U.S. Cl. .................................. 307/590; 307/597; 307/603; 307/491; 307/296.6
[58] Field of Search ............... 307/590, 594, 597, 600, 307/603, 605, 491, 296.6

[56] References Cited

U.S. PATENT DOCUMENTS 4,883,987  11/1989  Fattaruso ........................... 307/491
4,940,910  7/1990  Jiang ................................. 307/296.6

*Primary Examiner*—Stanley D. Miller
*Assistant Examiner*—Trong Phan
*Attorney, Agent, or Firm*—Nixon & Vanderhye, P.C.

[57] ABSTRACT

An output of a first amplifier is coupled to the input of a second amplifier by a coupling capacitor. A resistor connects one plate of the coupling capacitor to a reference voltage supplied by a potential divider. A field effect transistor is connected across the resistor with its gate connected to the connection between a further resistor and a further capacitor which are connected in series between power supply lines so that the coupling capacitor is rapidly charged when power is applied.

4 Claims, 1 Drawing Sheet

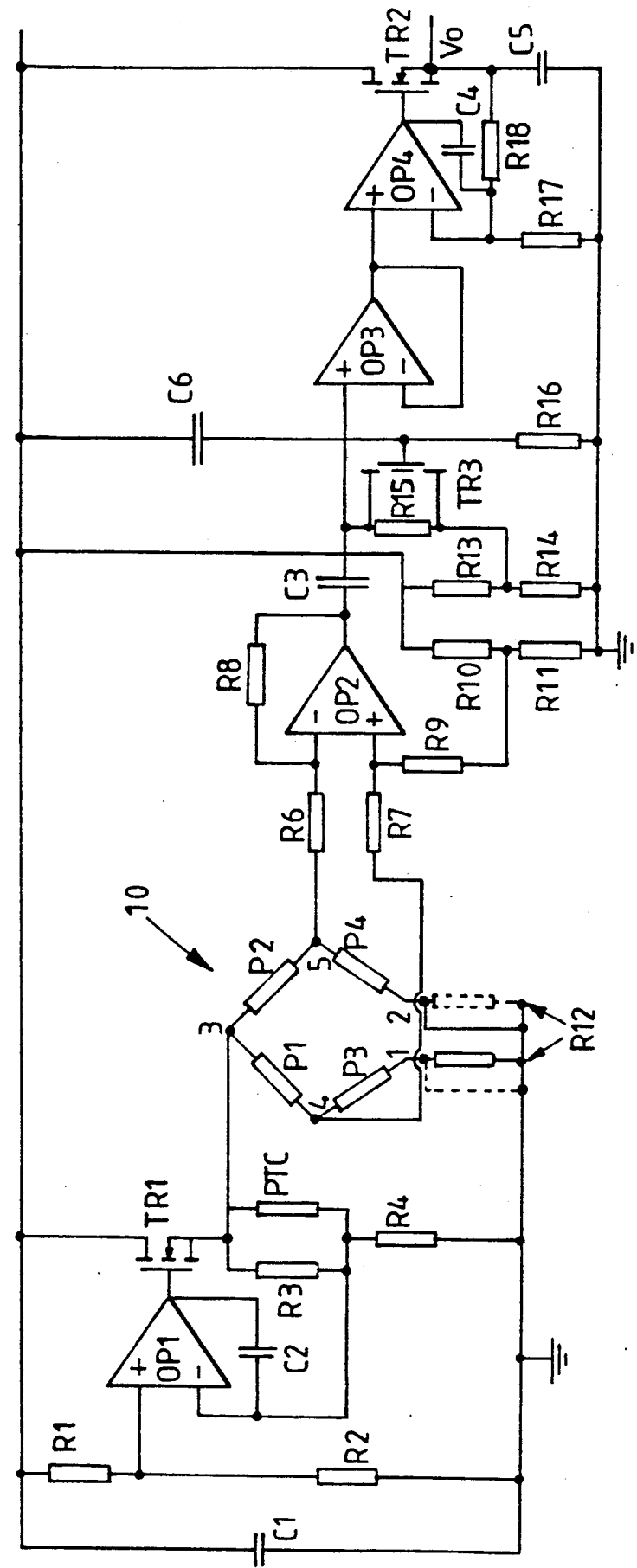

ELECTRICAL COUPLING CIRCUIT FOR PASSING A VARYING SIGNAL AND BLOCKING A DIRECT COMPONENT THEREOF

BACKGROUND OF THE INVENTION

1. Field of the Invention

The present invention relates to a coupling circuit.

2. Description of the Prior Art

Transducers whose sensitivity varies with temperature are widely used in industry. In general, it is necessary to provide some form of compensation for the temperature variation of the sensitivity. For instance, piezo-resistive bridge transducers when used in vehicles are subjected to a very wide range of temperatures, and compensation for the variation of sensitivity with temperature is essential in order for such transducers to provide a useful indication of a measured parameter.

GB2193577 discloses a semi-conductor pressure sensor in the form of a strain gauge bridge arrangement whose sensitivity falls as the temperature of the strain gauge elements increases. In order to compensate for this, the strain gauge bridge is supplied with a "constant" current which is arranged to increase with temperature so as to compensate at least partially for the fall in sensitivity with temperature. The current is supplied from the output of an operational amplifier whose non-inverting input is connected to a voltage reference in the form of a potential divider, one arm of which includes a thermistor.

A problem with this arrangement is that the output of the operational amplifier is required to supply a substantial current through the relatively low effective resistance of the bridge and, in order to do this, the output of the operational amplifier must be capable of approaching the power supply rail closely. However, when the output of an operational amplifier approaches the power supply line, the output current is limited and may well be less than that required to operate the bridge properly. Conversely, the relatively large output current which the bridge attempts to draw from the output of the operational amplifier causes a substantial voltage drop between the power supply line and the operational amplifer output. The result of this is to limit the effective range of the temperature compensation, and this can limit the effective use of the transducer, for instance where the power supply voltage is restricted. This is the case in automotive applications where the maximum power supply voltage is limited by the voltage of the vehicle battery and, in practice, may well have to be substantially less than this to allow for voltage regulation to ensure that automotive electronic circuits function correctly.

A bridge transducer, for instance of the piezo-resistive type, is generally connected to a differential amplifier whose output provides a signal which is a measure of the parameter sensed by the transducer. However, the output signal from such an amplifier generally has a direct component, which may vary with temperature and in some cases it is desirable to remove this before making use of the transducer signal. Where direct coupling is undesirable, AC coupling is normally employed to remove the direct component. However, because the desired varying component of the transducer signal can have components of very low frequency and such components must not be unduly attenuated by the coupling arrangement, resistance-capacitance coupling networks having very large resistance-capacitance products have to be employed. This results in the disadvantage of a relatively long settling time when power is applied to such circuit arrangements In particular, the capacitor has to be charged through the resistor of the coupling arrangement and the vary long RC time constant necessary to avoid undesirable low frequency attenuation can render the output signal from the transducer unusable for a substantial period of time until the capacitor has been sufficiently charged.

SUMMARY OF THE INVENTION

According to a first aspect of the invention, there is provided a transducer temperature compensation circuit, comprising a transducer arrangement connected to a temperature dependent power supply circuit, the power supply circuit comprising an operational amplifier whose output is buffered by a field effect transistor.

The presence of the field effect transistor allows the transducer arrangement to receive a voltage which can approach the power supply lines quite closely while supplying the necessary current to power the transducer arrangement. Thus, the use of an operational amplifier within the power supply for the transducer arrangement does not substantially limit the range of temperature compensation which can be provided for the temperature-varying senstivity of the transducer arrangement.

Preferably the field effect transistor is a depletion-mode field effect transistor, for instance a MOSFET. With such an arrangement, the power supply circuit can source relatively large currents at voltages which approach the power supply voltage very closely. With the field effect transistor turned on, the limiting factor is the channel on-resistance of the field effect transistor and, by selection of a suitable device, the voltage drop can be made negligible. Preferably a negative feed-back network is connected between the source of the field effect transistor and the inverting input of the operational amplifier. Preferably the negative feed-back network includes a temperature-dependent resistor and the non-inverting input of the operational amplifier is connected to a voltage reference source. Preferably a resistor of relatively small temperature co-efficient is connected in parallel with the temperature-dependent resistor. By suitable choice of values for the resistors, such an arrangement allows the sensitivity/temperature characteristic of the transducer arrangement to be compensated relatively accurately and over a relatively wide range of temperatures. In order to reduce noise, a capacitor may be connected across the temperature-dependent resistor.

Preferably the transducer arrangement comprises a transducer bridge, such as a piezo-resistor bridge. The accurate and wide range of temperature compensation provided by such arrangements allows transducers of this type to be used in environments where they are subjected to wide temperature variations. One such application is in the automotive industry where transducers mounted in vehicles are subjected to wide ranging temperatures during normal use of such vehicles.

According to a second aspect of the invention, there is provided a coupling circuit comprising;

- a coupling capacitor having an input plate and an output plate for blocking the direct component of a signal to be coupled;
- a controllable resistive path connected between the output plate and a circuit point which in use receives a reference voltage, the resistive path being controllable between a first state having a first resistance and a second state having a second resistance less than the first resistance;

and control means responsive to application of power to control the resistive path to be in the second state for a period following the application of power.

Such an arrangement allows the settling time of the coupling circuit to be greatly reduced by allowing the capacitor to be charged more quickly than would otherwise would be possible because of the time constant of the capacitor and the resistive path in its first state. This is especially useful for coupling circuits which are required to handle signals of very low frequencies, where the time constant of the coupling component can be tens or even hundreds of seconds in order to pass low frequency components with minimal attenuation. The time constant of the capacitor and the second resistance can be several orders of magnitude less than the time constant of the capacitor and the first resistance, so that the settling time of the circuit following the application of power is greatly reduced and the coupling circuit operates correctly with only a small, and generally insignificant, delay following switching on.

Preferably the control circuit comprises a first resistor and a further capacitor connected in series between power supply lines, the connection between the first resistor and the further capacitor being connected to a control input of the controllable resistive path. The time constant of the first resistor and the further capacitor of the control circuit can be selected in combination with the time constant of the coupling capacitor and the second resistance to ensure that the coupling capacitor is almost fully charged before the resistive path reverts to its first state. Preferably the controllable resistive path is a field effect transistor, such as a MOSFET, whose gate is connected to the control circuit and whose drain-source path is connected parallel to a second resistor. When the field effect transistor is turned off, the first resistance is provided by the second resistor whereas, when the field effect transistor is turned on, the second resistance is effectively provided by the channel resistance of the field effect transistor. In the case where the capacitor has a value of several microfarads and the second resistor has a value of several megohms, the channel resistance of the conducting field effect transistor may be of the order of a few tens of ohms, so that the capacitor is charged very rapidly at switch on. The settling time is therefore reduced by several orders of magnitude and can be made insignificant for operation of the coupling circuit.

The coupling circuit according to the second aspect of the invention may be used in an output circuit of the transducer temperature compensation circuit according to the first aspect of the invention.

BRIEF DESCRIPTION OF THE DRAWING

The invention will be further described, by way of example, with reference to the accompanying drawing, which is a circuit diagram illustrating a transducer temperature compensation circuit and coupling circuit constituting a preferred embodiment of the invention.

DETAILED DISCUSSION OF PREFERRED EMBODIMENTS

A piezo-resistor transducer 10 for use as an accelerometer transducer in a vehicle comprises piezo-resistors P1 to P4 arranged in a bridge configuration. Transducers of this type are well known and the specific transducer 10 and its detailed construction will not therefore be described further. The transducer bridge has output terminals 4 and 5 and three power supply terminals 1, 2, and 3. One of the terminals 1 and 2 is connected to the common line via a resistor R12 so as to calibrate the transducer for zero acceleration. The other of the terminals 1 and 2 is connected directly to the common line (the drawing shows the alternate construction in dotted lines for the purpose of illustration). The circuit receives a five volt power supply, for instance from a voltage regulator connected to the vehicle battery, a decoupling capacitor C1 being connected between the positive supply line and the common line. A voltage divider formed by resistors R1 and R2 is connected between the positive supply line and the common line with the tapping point connected to the non-inverting input of an operational amplifier OP1. The output of the amplifier is connected to the gate of a depletion mode metal oxide field effect transistor TR1 whose drain is connected to the positive supply line and whose source and substrate are connected to the terminal 3 of the transducer 10. The inverting input of the operational amplifier OP1 is connected via a capacitor C2 to the output of the operational amplifier and via a resistor R4 to the common line. The inverting input is further connected to the source of the field effect transistor TR1 via the parallel or combination of a resistor R3 and a positive temperature co-efficient resistor PTC.

The output terminals 4 and 5 of the transducer 10 are connected via resistors R6 and R7 to the inverting and non-inverting inputs, respectively, of an operational amplifier OP2. The inverting input of the operational amplifier OP2 is connected via a negative feed-back resistor R8 to the output and the non-inverting input is connected via a resistor R9 to the tapping point of a potential divider formed by the resistors R10 and R11 connected in series between the positive supply line and the common line. The output of the amplifier OP2 is connected via a coupling capacitor C3 to the non-inverting input of an operational amplifier OP3, whose inverting input is connected to the output thereof. The non-inverting input of the operational amplifier OP3 is connected via the parallel combination of a resistor R15 and the source-drain circuit of a depletion-mode metal oxide silicon field effect transistor TR3 to the tapping point of a potential divider formed by resistors R13 and R14 connected in series between the positive supply line and the common line. The gate of the transistor TR3 is connected to the first terminal of a capacitor C6 whose second terminal is connected to the positive supply line and to the first terminal of a resistor R16 whose second terminal is connected to the common line.

The output of the operational amplifier OP3 is connected to the non-inverting input of an operational amplifier OP4. The output of the operational amplifier OP4 is connected to the gate of a depletion-mode metal oxide silicon field effect transistor TR2, whose drain is connected to the positive supply line and whose source provides the output signal Vo of the circuit. A capacitor C5 is connected between the source of the transistor TR2 and the common line. The inverting input of the operational amplifier OP4 is connected to the output via a capacitor C4 and to the common line by a resistor R17. The inverting input is also connected via a feedback resistor R18 to the source of the transistor TR2.

The operational amplifier OP1 together with its associated components provides a power supply for the transducer 10. The field effect transistor TR1 provides an output buffer for the operational amplifier OP1 but is arranged within the negative feed-back loop. The reference voltage provided by the resistors R1 and R2 is amplified with a gain of (Rp+R4)/R4, where Rp is equal to the resistance of the parallel combination of the resistor R3 and the positive temperature co-efficient resistor PTC. The output voltage at the source of the transistor TR1 therefore depends on the resistance, and hence on the temperature, of the positive temperature co-efficient resistor PTC, and is supplied to the bridge 10. The bridge 10 responds to acceleration and the transducer output signal is derived by means of the differential amplifier formed by the operational amplifier OP2 and the associated resistors.

The output of the amplifier OP2 provides a signal comprising a varying component representing the desired output from the transducer and a direct component. This direct component varies with temperature, because of temperature variations in the values of the various resistors, and drifts with time because of the drift in characteristics of the various components with time. In order to block the direct component, the coupling capacitor C3 and the resistor R15 are provided and form a high pass filter having a turnover frequency sufficiently low to ensure that all required low frequency components of the transducer signal are passed substantially without attenuation. The operational amplifier OP3 is connected as a unity gain buffer with a high input impedance so as not to affect significantly the turnover frequency of the high pass filter. The operational amplifier OP4 provides a gain of two and supplies at the source of the transistor TR2 the output signal Vo. The provision of the transistor TR2 as an output buffer for the operational amplifier OP4 within the feed-back loop thereof provides sufficient current drive capability while permitting the output voltage to swing close to the positive supply line. The capacitors C2, C4, and C5 provide low pass filtering so as to remove relatively high frequency noise components from the output signal.

When power is applied to the circuit, the capacitor C6 is initially in a discharged state and is charged via the resistor R16. The gate of the transistor TR3 is therefore initially at the positive supply line voltage, causing the transistor to conduct and short circuit the resistor R15. The capacitor C3 therefore charges relatively rapidly with a time constant essentially dependent on its value and on the value of the resistors R13 and R14, the on resistance of the source-drain path of the transistor TR3 being negligible. When the voltage at the gate of the transistor TR3 has fallen sufficiently for the transistor TR3 to be turned off, the source-drain path assumes a relatively high resistance compared with the resistor R15 so that the turnover frequency of the high-pass filter formed by the capacitor C3 and the resistor R15 is substantially unaffected by the presence of the transistor TR3. The settling time is therefore greatly reduced without affecting the normal operation of the circuit.

In a practical embodiment of the invention, the capacitor C3 had a value of 15 microfarads and the resistor R15 a value of 2 megohms. The capacitor C6 had a value of 1 microfarad and the resistor R16 had a value of 2 megohms. The resistor R13 had a value of 30 kilohms and the resistor R14 had a value of 10 kilohms. The arrangement comprising the transistor TR3, the capacitor C6 and the resistor R16 therefore reduced the settling time of the high pass filter by more than one order of magnitude compared with a circuit not having these components.

In the practical embodiment referred to above, the transducer 10 was of type number 3021-005-P supplied by I.C.Sensors and the resistor R12 had a value of 28.7 ohms. The positive temperature co-efficient resistor PTC was of type number KTY13A supplied by Siemens and the resistors R1 to R4 had values of 25.8 kilohms, 10 kilohms, 2.7 kilohms, and 680 kilohms, respectively This ensured that the sensitivity of the transducer was substantially constant over a temperature range from minus 40° C. to 125° C. The transistor TR1 ensured that sufficient current could be supplied to the transducer 10 with the supply voltage very close to the positive supply line (5 volts).

I claim:

1. A coupling circuit comprising:
   a coupling capacitor having an input plate and an output plate for blocking a direct component of a signal to be coupled;
   means for providing a reference voltage;
   a controllable resistive path connected between said output plate of said capacitor and said reference voltage and having a control input, said controllable resistive path being controllable between a first state having a first resistance and a second state having a second resistance less than the first resistance in response to a control signal supplied to said control input; and
   control means connected to said control input and responsive to an application of power to said coupling circuit, for supplying said control signal so as to control said controllable resistive path to be in the second state for a period following the application of power and in the first state after the period.

2. A coupling circuit as claimed in claim 1, in which said control means comprises a first resistor connected between a first power supply line and a circuit point and a further capacitor connected between a second power supply line and said control input being circuit point, said connected to said circuit point.

3. A coupling circuit as claimed in claim 1, in which the controllable resistive path comprises a second resistor and a field effect transistor having a drain-source path connected parallel to said second resistor and a gate connected to said control input.

4. A coupling circuit as claimed in claim 3, in which said reference voltage providing means comprises a potential divider connected between first and second power supply lines.

* * * * *